United States Patent
Neidhardt et al.

(10) Patent No.: US 11,231,458 B2
(45) Date of Patent: Jan. 25, 2022

(54) SYSTEM AND METHOD FOR ALIGNING A MEASUREMENT ANTENNA SUITABLE FOR RADIO FREQUENCY MEASUREMENT OF AN ANTENNA UNDER TEST

(71) Applicant: Rohde & Schwarz GmbH & Co. KG, Munich (DE)

(72) Inventors: Steffen Neidhardt, Munich (DE); Josef Schmoeller, Munich (DE); Corbett Rowell, Munich (DE); Daniel Markert, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 38 days.

(21) Appl. No.: 16/875,063

(22) Filed: May 15, 2020

(65) Prior Publication Data

US 2021/0356516 A1   Nov. 18, 2021

(51) Int. Cl.
*G01R 31/28*  (2006.01)
*G01R 31/302* (2006.01)
*H01Q 19/10*  (2006.01)

(52) U.S. Cl.
CPC ......... *G01R 31/3025* (2013.01); *H01Q 19/10* (2013.01)

(58) Field of Classification Search
CPC .. G01R 31/3025; G01R 31/302; G01R 31/28; H01Q 19/10
USPC ....................... 324/750.25, 754.21
See application file for complete search history.

(56) References Cited

U.S. PATENT DOCUMENTS

| 5,587,717 A | 12/1996 | Jang |
| 2017/0212215 A1* | 7/2017 | Hellinger ............... G01S 13/931 |
| 2018/0034565 A1* | 2/2018 | Tankielun ............... H01Q 3/267 |
| 2019/0393968 A1* | 12/2019 | Ioffe ..................... H04B 17/14 |
| 2020/0096554 A1* | 3/2020 | Orozco Valdes .. G01R 31/2822 |

FOREIGN PATENT DOCUMENTS

| EP | 1111714 A2 | 6/2001 |
| EP | 2982006 A1 | 2/2016 |
| EP | 3457492 A1 | 3/2019 |
| WO | 2014/161566 A1 | 10/2014 |

* cited by examiner

*Primary Examiner* — Lee E Rodak
*Assistant Examiner* — Robert P Alejnikov, Jr.
(74) *Attorney, Agent, or Firm* — Christensen O'Connor Johnson Kindness PLLC

(57) ABSTRACT

The present disclosure relates to a system for aligning a measurement system suitable for radio frequency measurement of a device under test. The system includes an alignment device, a measurement module and an indication module. The alignment device includes at least two alignment antennas configured to receive a signal over-the-air from a measurement antenna of the measurement system. The measurement module is configured to measure a phase difference between the at least two alignment antennas receiving the signal. The indication module is configured to indicate the measured phase difference between the at least two alignment antennas or a reference quantity associated with the measured phase difference. Further, a method of aligning a measurement system used for radio frequency measurement of a device under test is described.

20 Claims, 2 Drawing Sheets

SYSTEM AND METHOD FOR ALIGNING A MEASUREMENT ANTENNA SUITABLE FOR RADIO FREQUENCY MEASUREMENT OF AN ANTENNA UNDER TEST

FIELD OF THE DISCLOSURE

The present disclosure relates to a system for aligning a measurement antenna suitable for radio frequency measurement of an antenna under test. Further, the present disclosure relates to a method of aligning a measurement antenna suitable for radio frequency measurement of an antenna under test.

BACKGROUND

In modern measurement systems used for radio frequency measurement of a device under test (DUT) used for radio frequency (RF) communication, over-the-air (OTA) testing becomes more popular while replacing the well-known conductive testing due to higher integration, higher frequencies and larger antenna systems.

However, the radio frequency over-the-air (OTA) measurement applications require an alignment between the device under test (DUT) and the measurement system, particularly a measurement antenna of the measurement system. This is necessary since the correct alignment has a significant impact on the quality of the measurement result. The respective alignment includes the positioning and orientation of both, namely the device under test as well as the measurement system, particularly its measurement antenna. For instance, any deviation under the alignment translates one to one into a deviation in the measurement.

So far, complex and iterative procedures are known that are used to align the entire system while using expensive measurement equipment which however does not provide a satisfying accuracy concerning the alignment since a manual interaction is necessary. The iterative procedures may comprise a manual positioning of the measurement antenna as well as an analysis of respective changes of radio frequency (RF) parameters, such as amplitude and/or phase, due to the manual (re-)positioning. In fact, several iterations of the above-mentioned steps are required to achieve an alignment that fulfills the respective requirements. Therefore, trained personnel is needed to perform the steps mentioned above due to the complexity of the steps and the necessary manual interaction which requires a certain amount of experience.

Accordingly, there is need for a cost-effective and fast way to align a measurement system in an appropriate manner, preferably in a more automatic manner.

SUMMARY

The present disclosure provides a system for aligning a measurement system suitable for radio frequency measurement of a device under test. In an embodiment, the system comprises an alignment device, a measurement circuit or module and an indication module, such as an indicator, an indication circuit, etc. The alignment device comprises at least two alignment antennas configured to receive a signal over-the-air from a measurement antenna of the measurement system. The measurement module is configured to measure a phase difference between the at least two alignment antennas receiving the signal. The indication module is configured to indicate the measured phase difference between the at least two alignment antennas or a reference quantity associated with the measured phase difference.

Further, the present disclosure provides a method of aligning a measurement system used for radio frequency measurement of a device under test. The method comprises the steps of:

providing a system that comprises a measurement antenna of the measurement system, an alignment device with at least two alignment antennas, a measurement circuit or module and an indication circuit or module;

transmitting a signal over-the-air from the measurement antenna;

receiving the signal transmitted by the measurement antenna via the at least two alignment antennas;

measuring a phase difference between the at least two alignment antennas receiving the signal via the measurement module; and indicating via the indication module, such as an indicator, an indication circuit, etc., the measured phase difference between the at least two alignment antennas or a reference quantity associated with the measured phase difference.

Accordingly, a cost-effective and fast way to align the measurement system is provided since the measured phase difference or a reference quantity associated therewith is indicated directly by the indication module. Accordingly, it is not necessary anymore to analyze any change of radio frequency parameters manually, wherein the respective changes were gathered by expensive radio frequency measurement equipment. In some embodiments, the alignment device having the at least two alignment antennas is sufficient that can be operated by less trained personnel. This is achieved since the overall manual interaction required for adjusting the system is reduced to a minimum, for example no iterative steps are required anymore. The former complex procedure is avoided which was fault-prone.

Since the measured phase difference can be indicated directly, it is also not necessary to interpret the measurement results obtained by the expensive radio frequency measurement equipment, namely the respective change of any radio frequency parameter, while simultaneously deriving any errors in alignment from the respective measurement results.

In contrast to the state of the art, the present disclosure provides distributed antennas that are provided by a single device, namely the alignment device. In some embodiments, no mathematical calculations are required to achieve the respective outcome that is used for aligning the measurement system.

The system comprises the measurement system that is associated with the alignment device such that the measurement system automatically processes signals received from the at least two alignment antennas in order to determine the phase difference between the distributed alignment antennas and to forward the phase difference derived to the indication module.

In some embodiments, the measurement module is generally configured to measure or rather gather the phases of the respective signals received at the at least two different alignment antennas that correspond to two different points. Furthermore, the measurement module is configured to compare the phases with each other and, therefore, to determine the phase difference between them.

Moreover, the measurement module may determine the reference quantity that is associated with the measured phase difference, for instance in a mathematical manner.

The measurement module as well as the indication module may be part of the alignment device. Put differently, the alignment device in some embodiments is a single device that comprises the at least two alignment antennas, the measurement module as well as the indication module in an integrated manner.

Generally, it is ensured that personnel can perform the respective alignment without any radio frequency (RF) knowledge or without any particular training for the respective alignment. In some embodiments, a fail-proof system is provided since it concerns a lean setup for alignment.

In addition, the alignment is faster since the iterative procedure is not required anymore.

An aspect provides that the indication module is configured to indicate the measured phase difference or the reference quantity via at least one of light and sound. Thus, the indication module may issue an optical signal and/or an acoustic signal in order to indicate the measured phase difference or the reference quantity which can be used for aligning the measurement system. The optical signal and/or the acoustic signal ensure(s) an easy operability of the entire system, for example the alignment device.

Another aspect provides that the indication module comprises, for example, a display for indicating the measured phase difference or the reference quantity. Hence, a value of the measured phase difference may be displayed for informing an operator of the system accordingly. The reference quantity may also be displayed which is associated with the measured phase difference.

Moreover, the indication module may be configured to indicate at least one correction factor for aligning the measurement system. Hence, the indication module outputs information how to align the measurement system appropriately such that the operator does not have to translate any measurement result into corrective measures for aligning the measurement system. The correction factor may relate to the reference quantity since it may correspond to a corrective measure that is associated with the phase difference.

In some embodiments, the correction factor corresponds to at least one of a pitching, a rolling its placement. Hence, the operator is informed with regard to a certain corrective movement to be performed in order to align the measurement system appropriately based on the phase difference measured.

For instance, the correction factor may relate to an alignment of the measurement antenna along a certain axis, for instance the x-axis and/or the y-axis, or to an adaption of an inclination angle associated with the measurement antenna.

Further, the correction factor may concern to an alignment of a reflector provided, for instance a movement along a certain axis, such as the z-axis and/or the x-axis, or rather a tilting in the direction of the z-axis and/or the y-axis.

Moreover, the correction may relate to an alignment of a holder or rather positioner for the device under test, for instance a movement along a certain axis, such as the x-axis, the y-axis and/or the z-axis, or rather a tilting in the direction of the x-axis, the y-axis and/or the z-axis.

Hence, the measurement system may comprise a reflector that is associated with the measurement antenna. The reflector can be used to provide far-field conditions at a test location of the measurement system. The test location may be associated with a holder or rather a positioner for the device under test. The measurement antenna transmits a signal towards a reflector which in turn reflects the signal towards the test location, thereby increasing the path for the signal transmitted which results in far-field conditions at the test location.

For instance, the measurement system is a compact antenna test range (CATR). The compact antenna test range typically comprises a measurement antenna as well as a reflector associated with the measurement antenna. The far-field conditions at the test location of the measurement system, namely the compact antenna test range, can be ensured due to the reflector even though the distance between the measurement antenna and the test location is smaller than the Fraunhofer distance defining far-field conditions.

According to another aspect, the system comprises a test location for the device under test, wherein the alignment device is located on the test location. The test location may be provided by a holder or rather a positioner, for instance a spherical positioner and/or a 3-dimensional positioner. Hence, the positioner relates to a typical positioner used in the measurement system for testing the device under test. In some embodiments, the device under test may relate to a user equipment, a base station or rather a radar sensor.

Another aspect provides that the alignment device comprises a printed circuit board (PCB) to which the at least two alignment antennas are connected. For instance, the two alignment antennas are placed on the printed circuit board while being connected with electrical lines provided by the printed circuit board. Therefore, the printed circuit board may serve as a carrier for the alignment antennas and optionally the indication module and/or the measurement module.

The indication module may also be located on the printed circuit board. As mentioned above, the indication module may be integrated in or at least placed or rather mounted on the printed circuit board such that an integrated alignment device is provided.

Furthermore, the alignment antennas may be distanced from each other on the printed circuit board by a distance that corresponds to an aperture of an antenna of the device under test. For instance, the alignment antennas may be distanced by 5 to 15 cm, for example 10 cm. The respective distance corresponding to the aperture of the antenna of the device under test ensures that proper operation of the measurement system can be ensured once it has been aligned. In some embodiments, it is ensured that no phase difference occurs in an area associated with the aperture of the antenna of the device under test.

Generally, the alignment antennas may be established as a patch antenna, a printed circuit board integrated antenna and/or a dedicated antenna. Thus, different types of antennas can generally be used that are placed on the printed circuit board. The printed circuit board integrated antenna may be integrated within the printed circuit board directly, namely the respective carrier.

The respective alignment antennas are located in a plane that is parallel to the main plane of the printed circuit board.

Further, the measurement module in some embodiments may comprise at least one of a phase detector, a comparator and a mixer, for example a down-converter. The respective components of the measurement module ensure that the phase difference can be measured easily. In addition, the correction factor can be determined by the measurement module In addition, the signal used for aligning the measurement system may have a frequency higher than 23 GHz, for example higher than 77 GHz. The respective frequency corresponds to the one that is used for testing the device under test, for instance a radar sensor. Generally, the alignment gets more and more demanding for high frequencies since performing a measurement of a device under test with high frequencies generally requires a good alignment in order to obtain reliable and accurate measurement results.

Further, the measurement antenna and/or a reflector assigned to the measurement antenna are/is pitched, rolled and/or moved to minimize the phase difference measured. Hence, the respective correction factor providing information concerning the corrective movement may be applied on the measurement antenna and/or the reflector assigned to the measurement antenna. In some embodiments, both components of the measurement system, namely the measurement antenna and the reflector, have an influence on the impinging direction of signals transmitted towards the test location.

Moreover, the measured phase difference or the reference quantity may be used to verify whether far-field conditions are provided in an area in which the at least two alignment antennas are located. The respective area is associated with the test location of the measurement system. Thus, it can be verified whether or not the measurement system, for example the compact antenna test range, provides far-field conditions at the test location. In other words, the functionality of the measurement system can be verified by the alignment device in an appropriate manner.

In addition, the measurement antenna may be coarsely pre-aligned previously. In order to reduce the efforts required for aligning the measurement system, the measurement antenna is at least coarsely pre-aligned such that any phase difference measured is small such that any alignment required is relatively small.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
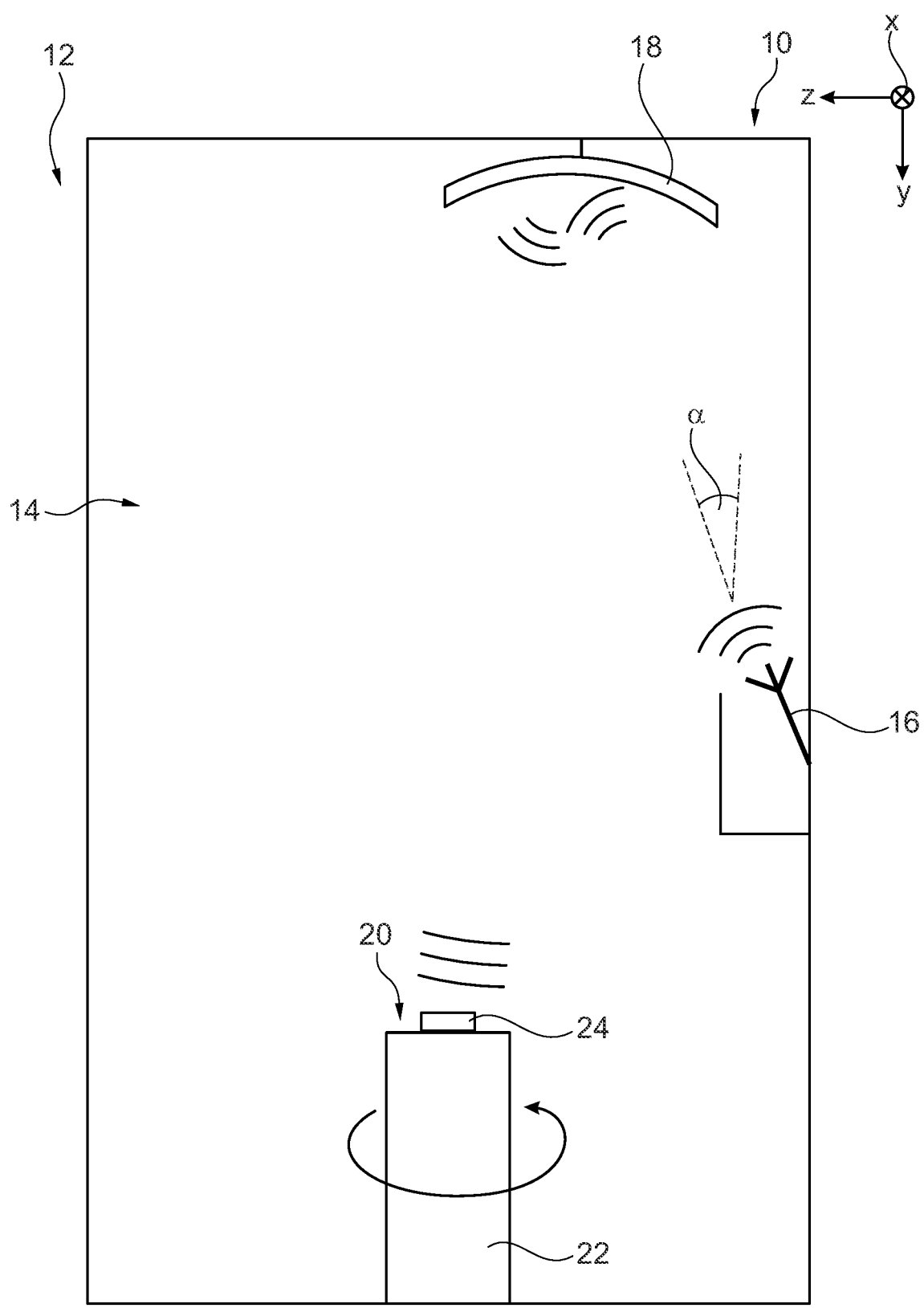
FIG. 1 schematically shows a representative measurement system according to the present disclosure.

FIG. 1 shows a system 10 that is used for aligning a measurement system 12 that is suitable for radio frequency measurement of a device under test having at least one antenna for communication purposes. The measurement system 12 can be used for performing accurate measurement of the device under test over-the-air (OTA).

Generally, the measurement system 12 comprises a chamber 14, for instance an anechoic chamber or a shielded chamber, in which at least one measurement antenna 16, at least one reflector 18 as well as a test location 20 for the device under test are provided. The measurement system 12 further comprises a positioner 22 that is used to position the device under test. The positioner 22 may relate to a spherical positioner or a 3D-positioner (e.g., one or more angular and/or linear stages, etc.) which generally ensures a certain movement of the device under test during the measurement by the aligned measurement system 12, which is indicated by the arrow in FIG. 1.

Accordingly, the measurement system 12 may correspond to a typical compact antenna test range (CATR) that is used to test the device under test under different circumstances, for instance under far-field conditions.

Alternatively to the positioner 22, the measurement system 12 comprises a holder for the device under test that provides the test location 20. The holder is not movable in contrast to the positioner 22.

In any case, the measurement antenna 14 typically transmits a signal towards the reflector 16 which reflects the signal towards the test location 20.

However, the measurement system 12 has to be aligned appropriately in order to ensure accurate measurement results when testing the device under test. The respective alignment is ensured by the system 10 that also comprises an alignment device 24 that is located at the test location 20 during the alignment process that will be described hereinafter in more detail.

Figure 2:
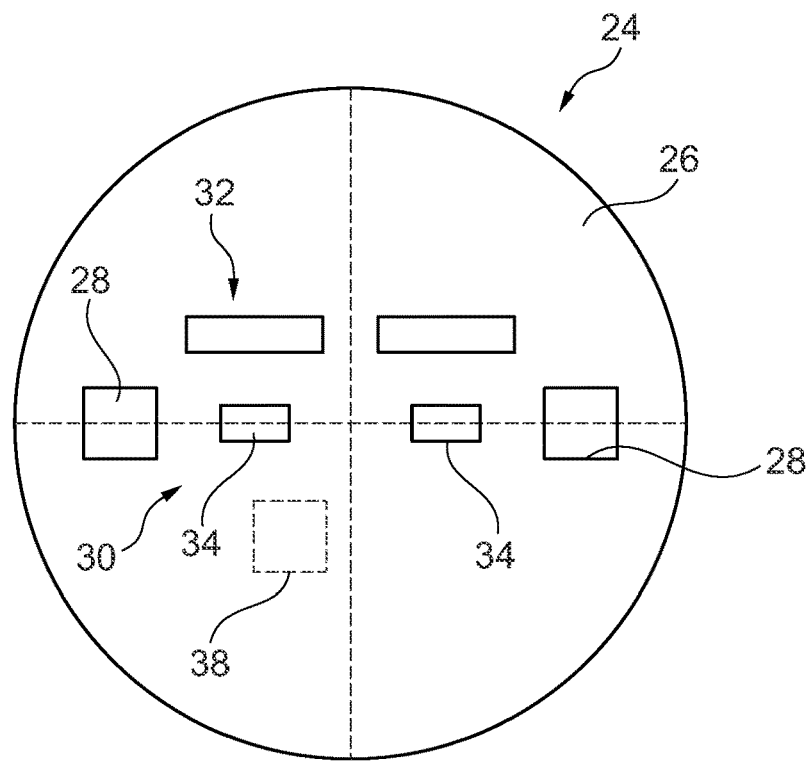
FIG. 2 schematically shows an alignment device used according to a first embodiment.
Figure 3:
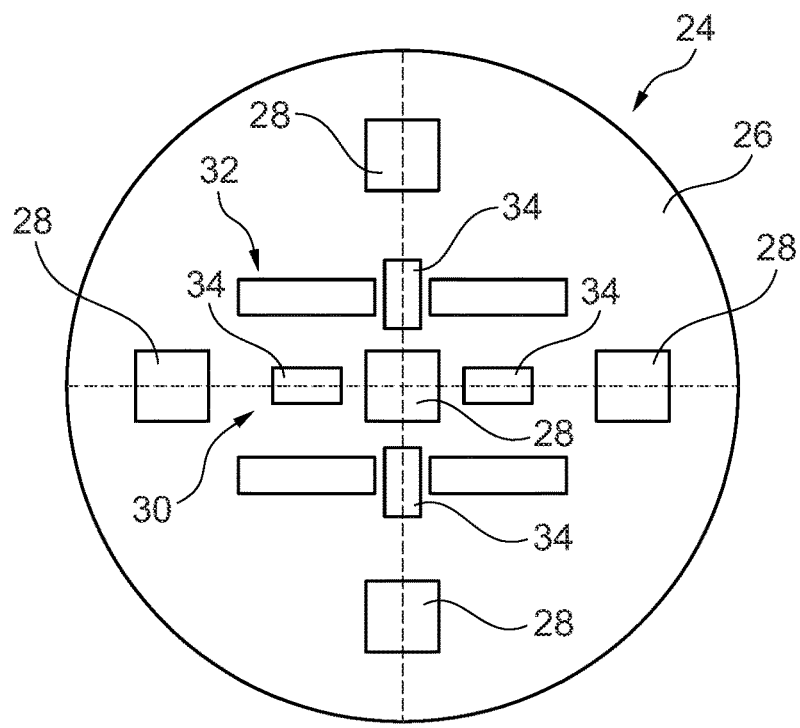
FIG. 3 schematically shows an alignment device according to a second embodiment.

The alignment device 24 is shown in more detail in FIGS. 2 and 3 in two different embodiments. The alignment device 24 is an integrated device that comprises a printed circuit board 26 that is established in a disc shape in the respective embodiment. The printed circuit board 26 serves as a carrier for at least two alignment antennas 28. The respective alignment antennas 28 may be patch antennas, PCB integrated antennas or dedicated antennas.

Generally, the alignment antennas 28 are distanced from each other by a distance that corresponds to an aperture of the antenna of the device under test that is typically tested by the measurement system 12. For instance, the alignment antennas 28 are distanced by about 10 cm.

FIGS. 2 and 3 reveal that the different alignment antennas 28 are each distanced from a center point of the printed circuit board 26 by a similar distance, resulting in locating the outer alignment antennas 28 on a circle around the center of the printed circuit board 26, wherein the radius of the circle corresponds to half the distance between opposite alignment antennas 28. In the center of the printed circuit board 26, a center alignment antenna 28 may be provided.

In addition, the system 10 comprises a measurement circuit or module 30 as well as an indication circuit or module 32 which are both located on the printed circuit board 26 as shown in FIGS. 2 and 3.

Accordingly, the alignment device 24 in some embodiments is a single device that comprises the alignment antennas 28, the measurement module 30 and the indication module 32.

The measurement module 30 comprises several measurement components 34 that are used to measure a phase difference between the alignment antennas 28 when receiving a respective signal. In some embodiments, the components 34 concern a phase detector, a comparator and/or a mixer. The measurement components 34 are associated with a respective alignment antenna 28 used for measurement purposes as indicated in FIGS. 2 and 3.

In FIG. 2, only two alignment antennas 28 are used for measuring a phase difference between them, for instance the ones located on a straight line crossing the center of the alignment device 24, for example the printed circuit board 26. For instance, the alignment antennas 28 located on the horizontal line are used for measuring the phase difference between them due to the measurement components 34 associated.

In contrast thereto, FIG. 3 shows that five alignment antennas 28 are provided wherein the phase difference of each of the outer alignment antennas 28 may be determined with respect to the one located in the center of the alignment device 24, for example the printed circuit board 26. Therefore, several measurement components 34 are provided.

In addition, the measurement module 30 is connected with the indication module 32 in a signal transmitting manner such that the results provided by the measurement module 30 can be outputted by the indication module 32 appropriately.

Generally, the alignment device 24 placed at the test location 20 of the measurement system 12 receives the signal transmitted by the measurement antenna 14 directly or indirectly via the reflector 18.

Since the alignment device 24 comprises the at least two alignment antennas 28, the alignment antennas 28 each receive the signal. The alignment antennas 28 are distanced from each other such that a phase difference may occur between the at least two alignment antennas 28 when receiving the signal which depends on the alignment of the measurement system 12.

The measurement module 30 is connected with the alignment antennas 28 in order to measure the respective phases at the alignment antennas 28, to compare the phases measured and to measure/determine the phase difference between the at least two alignment antennas 28.

Then, the measurement module 30 forwards the respective result, namely the measured phase difference, to the indication module 32 that indicates the measured phase difference.

The indication module 30 also comprises several indication components 36 that may be associated with the respective alignment antennas 28 used such that the respective information concerning each of the alignment antennas 28 can be indicated individually. In some embodiments, the indication module 32 may indicate the measured phase difference or rather the reference quantity associated by light and/or sound, namely as an optical signal and/or an acoustic signal. Alternatively, the indication module 32 may comprise a display 38 as indicated by the dashed lines in FIG. 2. The display 38 can be used to display all information gathered together.

Generally, the respective components 34, 36 of the measurement module 30 or rather the indication module 32 may be integrated in the printed circuit board 26 that already provides the respective electrical lines for interconnecting the components 34, 36.

Accordingly, a circuit is provided on the printed circuit board 26 that comprises at least the components 34, 36 of the measurement module 30 and/or the indication module 32.

For instance, integrated circuits may be provided that are located on the printed circuit board 26 in some embodiments.

In general, the indication module 30 does not necessarily have to indicate the phase difference measured, but reference quantity associated with the measured phase difference, for instance at least one correction factor for aligning the measurement system 12.

Hence, the indication module 32 may be also configured to indicate at least one correction factor for aligning the measurement system 12, for example the measurement antenna 16 and/or the reflector 18.

The correction factor may correspond to a pitching, a rolling and/or a displacement movement to be performed by the measurement antenna 16 and/or the reflector 18 in order to align the measurement system 12 as shown in FIG. 1.

Accordingly, the correction factor may relate to an alignment of the measurement antenna 16 along a certain axis, for instance the x-axis and/or the y-axis, or to an adaption of an inclination angle α associated with the measurement antenna 16.

Further, the correction factor may concern an alignment of the reflector 18, for instance a movement along a certain axis, such as the z-axis and/or the x-axis, or rather a tilting in the direction of the z-axis and/or the y-axis.

Moreover, the correction may relate to an alignment of the positioner 22 or rather holder for the device under test, for instance a movement along a certain axis, such as the x-axis, the y-axis and/or the z-axis, or rather a tilting in the direction of the x-axis, the y-axis and/or the z-axis.

When aligning the measurement system 12, the respective user follows the indications provided by the indication module 32 appropriately such that the measurement antenna 16 and/or the reflector 18 assigned to the measurement antenna 16 are/is pitched, rolled and/or moved accordingly in order to minimize the phase difference measured between the alignment antennas 28.

Generally, the measured phase difference and the reference quantity associated with the measured phase difference may also be indicated or rather displayed together.

In other words, at least one of the measured phase difference and the reference quantity is indicated or rather displayed. Put differently, the measured phase difference and/or the reference quantity is indicated or rather displayed.

Since the measured phase difference and/or the reference quantity, for instance the correction factor, are/is indicated, a faster and more automatic alignment of the measurement system 12 can be ensured. In some embodiments, the iterative procedure necessary in the prior art can be avoided effectively by the system 10 and the method described.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A system for aligning a measurement system suitable for radio frequency measurement of a device under test, the system comprising: an alignment device, a measurement circuit and an indicator, the alignment device comprising at least two alignment antennas configured to receive a signal over-the-air from a measurement antenna of the measurement system, the measurement circuit being configured to measure a phase difference between the at least two alignment antennas receiving the signal, and the indicator being configured to indicate either (a) the measured phase difference between the at least two alignment antennas or (b) a reference quantity associated with the measured phase difference.

2. The system according to claim 1, wherein the indicator is configured to indicate the measured phase difference or the reference quantity via at least one of light and sound.

3. The system according to claim 1, wherein the indicator comprises a display for indicating the measured phase difference or the reference quantity.

4. The system according to claim 1, wherein the indicator is configured to indicate at least one correction factor for aligning the measurement system.

5. The system according to claim 4, wherein the correction factor corresponds to at least one of a pitching, a rolling and a displacement.

6. The system according to claim 1, wherein the measurement system comprises a reflector that is associated with the measurement antenna.

7. The system according to claim 1, wherein the measurement system is a compact antenna test range.

8. The system according to claim 1, wherein the system comprises a test location for the device under test, wherein the alignment device is located on the test location.

9. The system according to claim 1, wherein the alignment device comprises a printed circuit board to which the at least two alignment antennas are connected.

10. The system according to claim 9, wherein the indicator is also located on the printed circuit board.

11. The system according to claim 9, wherein the alignment antennas are distanced from each other on the printed circuit board by a distance that corresponds to an aperture of an antenna of the device under test.

12. The system according to claim 1, wherein the alignment antennas are established as at least one of a patch antenna, a printed circuit board integrated antenna and a dedicated antenna.

13. The system according to claim 1, wherein the measurement circuit comprises at least one of a phase detector, a comparator and a mixer.

14. A method of aligning a measurement system used for radio frequency measurement of a device under test, the method comprising:
providing a system that comprises a measurement antenna of the measurement system, an alignment device with at least two alignment antennas, a measurement circuit and an indicator;
transmitting a signal over-the-air from the measurement antenna;
receiving the signal transmitted by the measurement antenna via the at least two alignment antennas;
measuring a phase difference between the at least two alignment antennas receiving the signal via the measurement circuit; and
indicating via the indicator either (a) the measured phase difference between the at least two alignment antennas or (b) a reference quantity associated with the measured phase difference.

15. The method according to claim 14, wherein the alignment device comprises a printed circuit board on which the at least two alignment antennas are located, and wherein the alignment device comprises the measurement circuit and the indicator that is located on the printed circuit board.

16. The method according to claim 14, wherein the indicator indicates the measured phase difference or the reference quantity via at least one of light and sound.

17. The method according to claim 14, wherein the indicator indicates at least one correction factor for aligning the measurement antenna.

18. The method according to claim 14, wherein at least one of the measurement antenna and a reflector assigned to the measurement antenna is at least one of pitched, rolled and moved to minimize the phase difference measured.

19. The method according to claim 14, wherein the measured phase difference or the reference quantity is used to verify whether far-field conditions are provided in an area in which the at least two alignment antennas are located.

20. The method according to claim 14, wherein the measurement antenna is coarsely pre-aligned previously.

* * * * *